United States Patent
Yee et al.

[11] Patent Number: 6,118,669
[45] Date of Patent: Sep. 12, 2000

[54] ROUTING TOPOLOGY FOR IDENTICAL CONNECTOR POINT LAYOUTS ON PRIMARY AND SECONDARY SIDES OF A SUBSTRATE

[75] Inventors: Dawson L. Yee, Beaverton, Oreg.; Earl Roger Noar, Lacey, Wash.

[73] Assignee: Intel Corporation, Santa Clara, Calif.

[21] Appl. No.: 09/023,388

[22] Filed: Feb. 13, 1998

[51] Int. Cl.[7] .............................. H05K 1/14; H05K 1/16; H05K 1/18
[52] U.S. Cl. ......................... 361/777; 361/783; 361/792
[58] Field of Search .............................. 29/832; 174/260, 174/261, 255; 257/723, 724, 786, 905, 919; 324/755, 765; 333/250, 246, 254, 247, 260; 361/748, 760, 772, 773, 774, 777, 778, 783, 792, 793–795; 365/51, 52, 63, 72, 189.01; 438/129; 439/68, 69

[56] References Cited

U.S. PATENT DOCUMENTS

| | | | |
|---|---|---|---|
| 5,144,578 | 9/1992 | Sakagami | 365/63 |
| 5,557,564 | 9/1996 | Haraguchi et al. | 365/63 |
| 5,831,890 | 11/1998 | Selna et al. | 365/51 |
| 5,838,627 | 11/1998 | Tomishima et al. | 365/51 |
| 5,841,686 | 11/1998 | Chu et al. | 365/51 |
| 5,856,937 | 1/1999 | Chu et al. | 365/51 |

*Primary Examiner*—Donald Sparks
*Attorney, Agent, or Firm*—Alan K. Aldous

[57] ABSTRACT

Under one aspect of the invention, the invention includes a multilayered substrate. The substrate includes a primary side having a first group of connection points, including a first connection point, having a first layout to interface with a first chip. The substrate also includes a secondary side having a second group of connection points, including a second connection point, having a layout identical to the first layout, to interface with a second chip. The substrate also includes an intermediate connection point coupled to the first and second connection points through first and second branch traces each having substantially the same electrical length.

19 Claims, 3 Drawing Sheets

ROUTING TOPOLOGY FOR IDENTICAL CONNECTOR POINT LAYOUTS ON PRIMARY AND SECONDARY SIDES OF A SUBSTRATE

BACKGROUND OF THE INVENTION

1. Technical Field of the Invention

The present invention relates to trace routing topologies and, more particularly, to topologies that allow for identical connection point layouts on primary and secondary sides of a substrate.

2. Background Art

Some processors, such as microprocessors, utilize an off-chip cache chip (sometimes called L2 caches) to hold data for use by a processor chip of the processor. The cache chip is mounted on a substrate such as a printed circuit board and is connected to processor core chip through a high speed bus.

For example, the Pentium® II processor manufactured by Intel Corporation includes a substrate to which a processor chip and a cache chip are connected. The substrate includes connector points that are mated with connector points on the processor chip and cache chip to connect the processor chip and cache chip to the substrate. The substrate includes multiple layers. Traces are connected to the connector points of the substrate to couple various ones of connectors points of one chip to various ones of connectors points of other chips. To avoid the traces coming into contact with each other, the traces are routed in particular configurations. Traces can be routed through various layers, which are connected through vias, in order to avoid having traces contact each other. The substrate is connected to a connector, which may be attached to a motherboard, through goldfingers on a single edge connector.

A connector point on a single chip has been coupled to a connector point on more than one chip in the same relative layout position on the same side of a substrate through multiple branch traces, including those of substantially equal length from an intermediate connector point.

A substrate such as that used in the Pentium® II processor includes multiple layers. Each layer adds complexity and expense. Further, the addition of vias adds complexity (for example by blocking trace routing channels) and expense.

SUMMARY OF THE INVENTION

Under one aspect of the invention, the invention includes a multilayered substrate. The substrate includes a primary side having a first group of connection points, including a first connection point, having a first layout to interface with a first chip. The substrate also includes a secondary side having a second group of connection points, including a second connection point, having a layout identical to the first layout, to interface with a second chip. The substrate also includes an intermediate connection point coupled to the first and second connection points through first and second branch traces each having substantially the same electrical length.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION OF PREFERRED EMBODIMENTS

Figure 1:
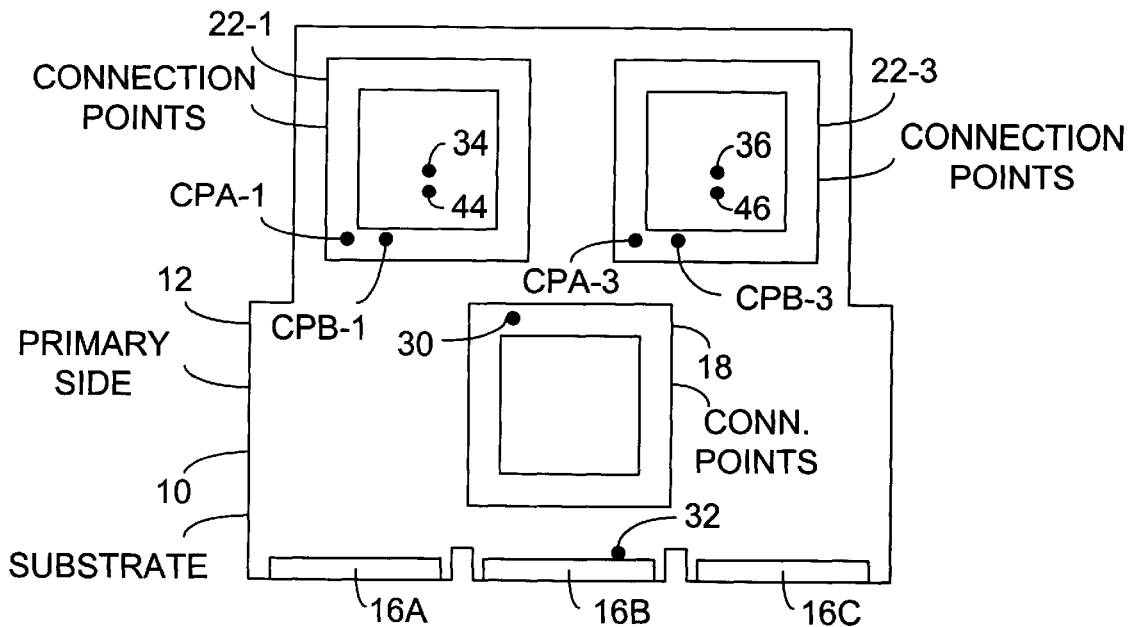
FIG. 1 is a view of a primary side of a substrate including connection points.
Figure 2:
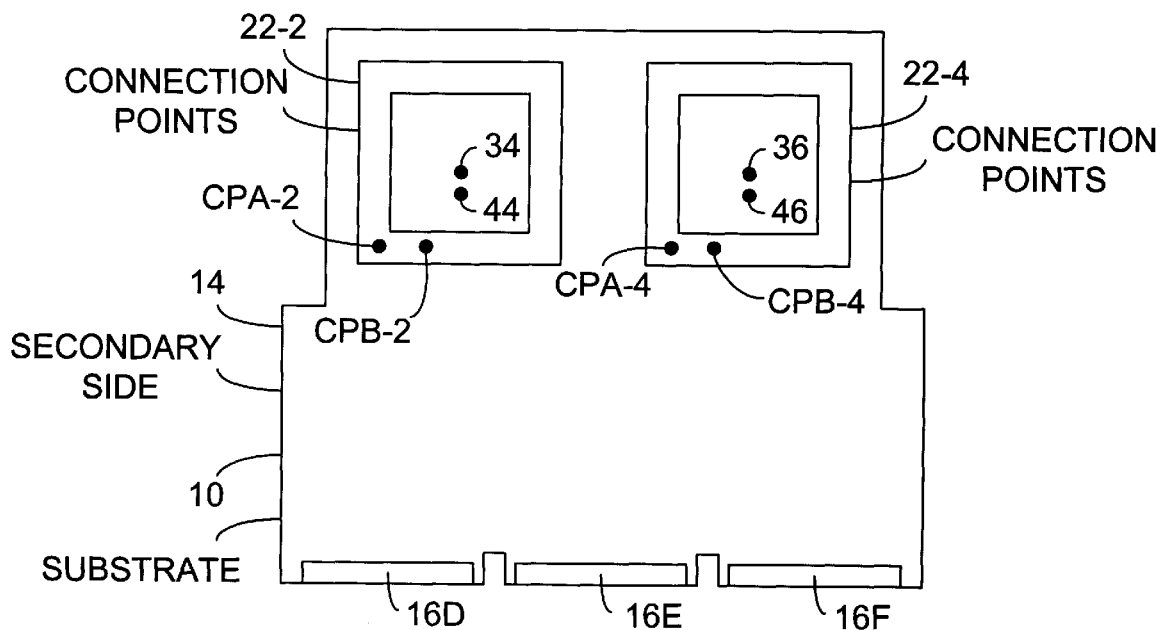
FIG. 2 is a cross-sectional view of a secondary side of the substrate of FIG. 1.

Referring to FIGS. 1 and 2, a substrate 10, which may be a printed circuit board, includes a primary side 12 and a secondary side 14. Substrate 10 includes five groups of connection points: a group of connection points 18 and groups of connection point 22-1, 22-2, 22-3, and 22-4. Merely as an example, the connection points may be pads on vias or other conductors. To show how connection points line-up, FIG. 2 is a cross-sectional view shown from the same view as FIG. 1. if it were shown from the opposite view, FIG. 2 would be a mirror image of what is now shown.

As an example, substrate 10 may be part of a processor that includes a processor chip that is connected to the group of connection points 18. The processor also includes four cache chips, each of which are connected to one of four groups of connection points 22-1, 22-2, 22-3, and 22-4. Each group of connection points has a layout. Chips also have a connection point layout. The connection points of chips may be pins, pads, or other conductors. By making the layout of groups of connection points 22-1, 22-2, 22-3, and 22-4 identical, the same cache chip may be used for both the primary and secondary sides of substrate 10. Accordingly, only one type of cache chip needs to be manufactured (i.e., only one cache chip conductor point layout is needed). As defined herein, if the connection point layout of two groups of connection points is identical, then an identical chip will work the same with either of the groups of connection points.

In particular, the following connection points are specifically illustrated: connection point 30 of the group of connection points 18; connection points CPA-1 and CPB-1 of the group of connection points 22-1; connection points CPA-2 and CPB-2 of the group of connection points 22-2; connection points CPA-3 and CPB-3 of the group of connection points 22-3; connection points CPA-4 and CPB-4 of the group of connection points 22-4; and a connection point 32.

Substrate 10 may include, for example, six groups of gold finger connections: 16A, 16B, 16C, 16D, 16E, and 16F. As an example, connection point 32 may be one of the gold finger connections or connected to one or more of the gold finger connections.

Substrate 10 includes vias 34, 36, 44, and 46. In the illustrated embodiment, the vias pass through each layer of substrate 10. In other embodiments, the vias do not extend through each layer. Vias 34, 36, 44, and 46 may be considered intermediate connection points. However, in the illustrated embodiment, vias 34, 36, 44, and 46 do not directly interface with chips, whereas connection points CPA-1, CPA-2, etc., do.

Figure 3:
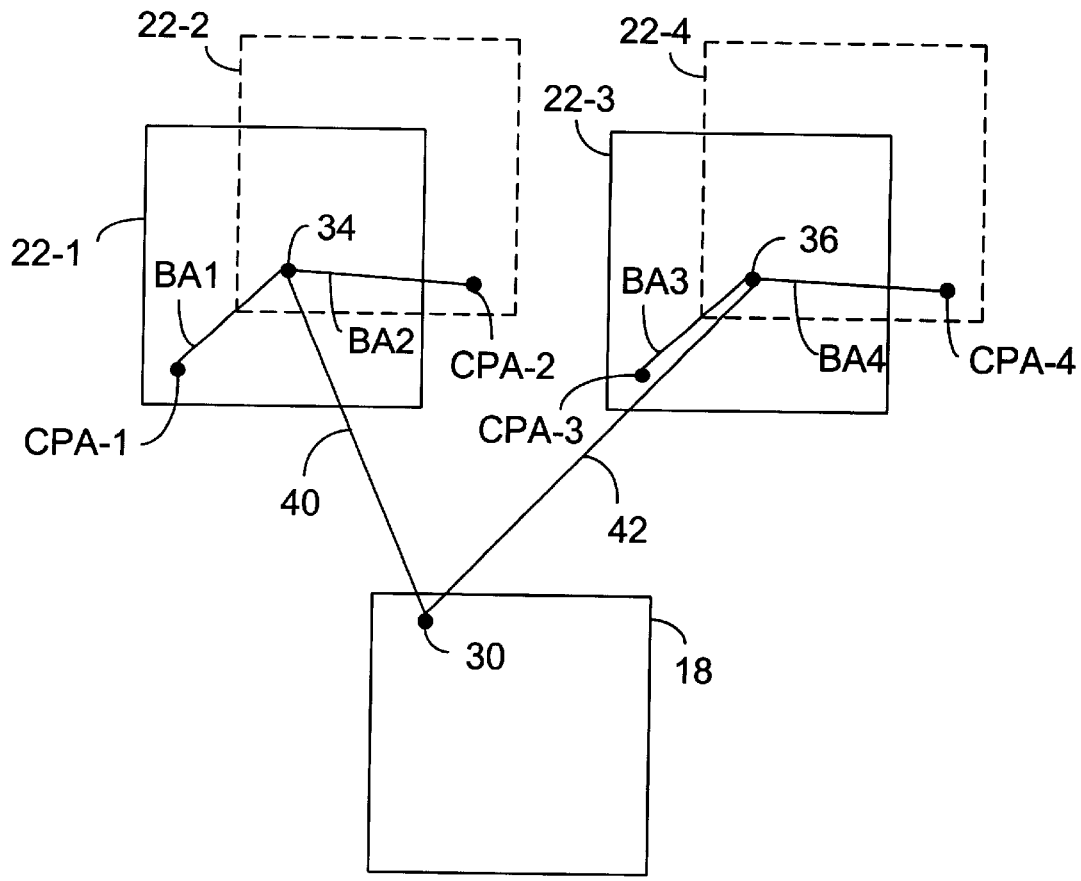
FIG. 3 is a schematic representation of trace connections between connections points of the substrate of FIG. 1.

Referring to FIGS. 1, 2, and 3, a root trace 40 is coupled between connection point 30 and via 34. A root trace 42 is coupled between connection point 30 and via 36. Root trace 40 and 42 should have substantially same electrical length. Electrical length is the flight time. An equal physical length may provide an equal electrical length. A purpose for having substantially the same electrical length is to reduce timing tolerances for signals between chips. The extent to which the electrical lengths must be substantially the same depends at least in part on the tolerances, which vary with implementation. The extent may also depend on how closely other traces (described below) have substantially the same electrical length. Because connection point 30 is closer to via 34 than it is to via 36, root trace 40 may have a bend (e.g., a serpentine configuration, not illustrated in FIG. 3) to add extra physical length originating trace 40 to match the electrical length of root trace 42. Root trace 42 may also have bends. The various traces mentioned herein do not necessarily have to have a constant width.

A branch trace BA1 is coupled between connection point CPA-1 and via 34. A branch trace BA2 is coupled between connection point CPA-2 and via 34. Branch traces BA1 and BA2 have substantially the same electrical length. A branch trace BA3 is coupled between connection point CPA-3 and via 36. A branch trace BA4 is coupled between connection point CPA-4 and via 36. Branch traces BA3 and BA4 have substantially the same electrical length. As noted, the vias do not have to extend completely through all layers. One or more of the traces may have a shape that is not straight (e.g., serpentine). Also, the width of the traces does not have to be uniform.

Figure 4:
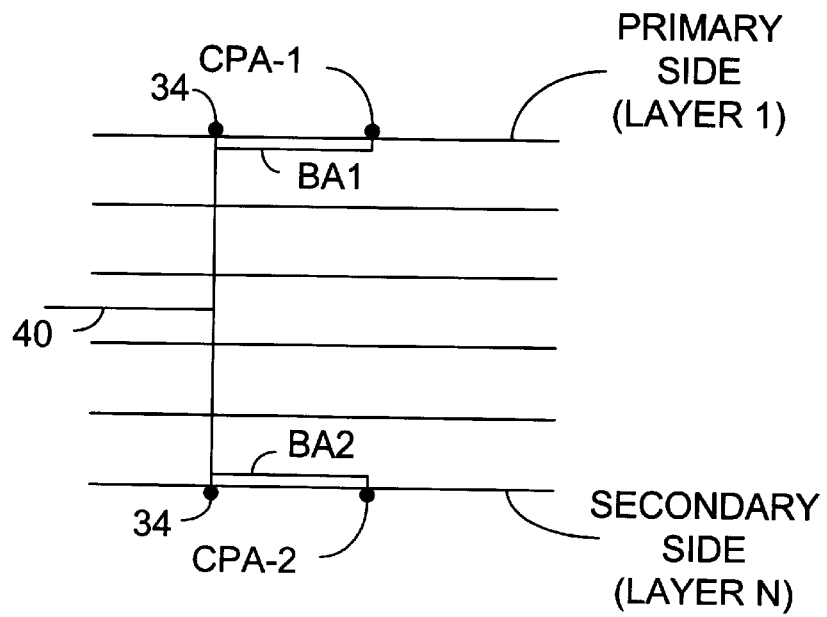
FIG. 4 is a simplified representation of a side view of the substrate of FIG. 1.

Referring to FIG. 4, substrate 10 includes N layers (not all of which are shown). FIG. 4 illustrates that root trace 40 may pass through an internal layer and connect to via 34 in an internal layer. In an alternative embodiment, root trace 40 may be replaced by multiple root traces or root/brand traces that pass through different layers and connect to different vias. Connector points CPA-1 and CPA-2 are displaced as suggested by FIGS. 1, 2, and 3 (i.e., one is not on top of the other). Connector points CPA-1 and CPA-2 could be pads connected to vias that extend through all layers (similar to via 34).

Figure 5:
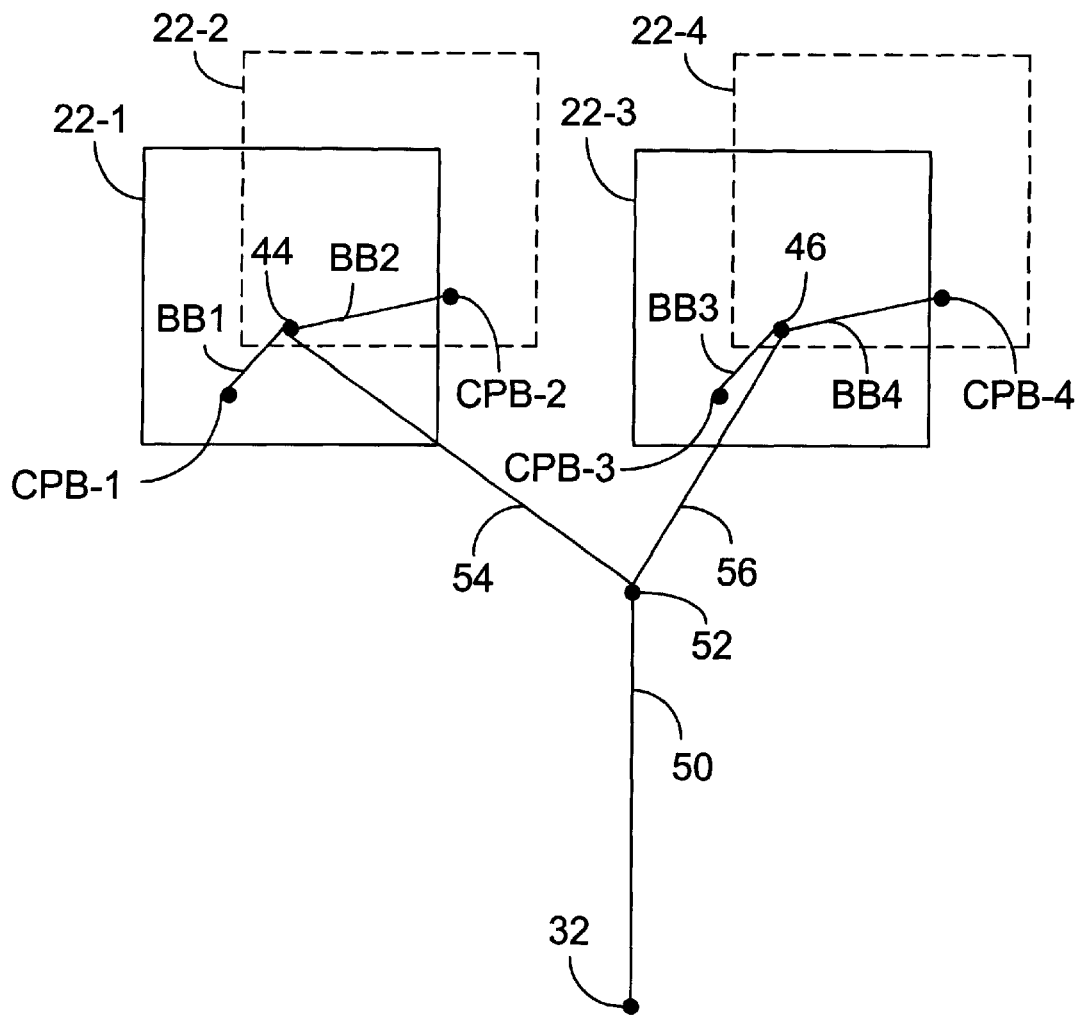
FIG. 5 is a schematic representation of trace connections between connections points of the substrate of FIG. 1.

FIG. 5 illustrates another type of trace routing topology which differs from that illustrated in FIG. 4. In FIG. 5, the trace routing topology includes a root trace 50 connected to root/branch traces 54 and 56. Root trace 50 may be connected to root/branch trace 54 and 56 through a via 52, which is a form of connection point. Branches BB1 and BB2 are connected to via 44 and connection points CPB-1 and CPB-2, respectively. Branches BB3 and BB4 are connected to via 46 and connection points CPB-3 and CPB-4. Branches BB1 and BB2 have substantially equal electrical lengths. Branches BB3 and BB4 have substantially equal electrical lengths.

The trace routing topology of FIG. 4 includes a V topology, whereas the trace routing topology of FIG. 5 includes a Y topology.

A root trace may be connected to more than two branch traces or root/branch traces.

Figure 6:
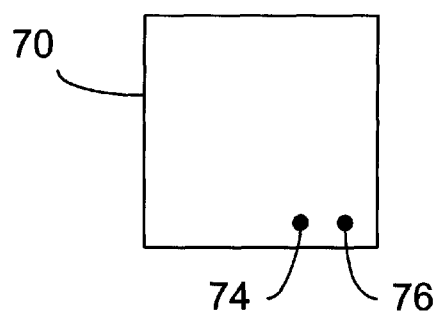
FIG. 6 is a bottom view of a chip to be connected to connection points of FIG. 1 or FIG. 2.
Figure 7:
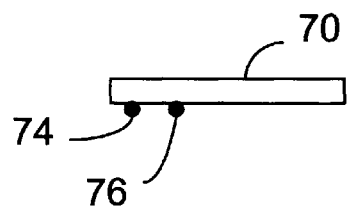
FIG. 7 is a side view of the chip of FIG. 6.

FIG. 6 illustrates a bottom view of a chip 70 and two connection points 74 and 76 which may be connected to connections points CPA-1 and CPB-1, or CPA-2 and CPB-2, or CPA-3 and CPB-3, or CPA-4 or CPB-4. FIG. 7 shows a side view of chip 70. Because of the trace topology, only one type of chip 70 is needed.

Connection points to interface with chips (e.g., CPA-1) may be a driving and/or receiving points.

A substrate would be far simpler than substrate 10 if mirror image chips where used on each side. Indeed, the internal layer, traces and intermediate connections (34, 36, 44, and 46) illustrated in FIGS. 3, 4, and 5 of substrate 10 add complexity and expense to substrate 10. Accordingly, the invention is counter-intuitive.

Substrate 10 may include well known materials and circuits, and materials and circuits that are not well known. Substrate 10 may be constructed according to well known techniques and processes, and also according to techniques and processes that are not well known.

In a commercial implementation, there would be other connection points and groups of connection points which are not illustrated herein because they do not further add to the understanding of the invention and would clutter of the figures, tending to obscure the invention. The invention is not restricted to use in a processor, but may be used in connection with various other substrates, circuit boards, and chips.

As will be apparent to those skilled in the art, the relative sizes of the various components on the substrate (e.g., vias, connections points) are exaggerated for purposes of illustration. The connection points do not have to be circular or spherical. The borders of the boxes in the figures are for illustrative purposes and do not restrict the boundaries of the components, which may overlap. The relative size of the illustrative components does not to suggest actual relative sizes. The term "conductor" is intended to be interpreted broadly and includes devices that conduct although they also have some insulating properties. There may be intermediate components or conductors between the illustrated components and conductors.

If the specification states a component or feature "may", "can", "could", or "might" be included or have a characteristic, that particular component or feature is not required to be included or have the characteristic. The term "responsive" includes completely or partially responsive.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A multilayered substrate, comprising:
    a primary side including a first group of connection points, including a first connection point, having a first layout to interface with a first chip;
    a secondary side including a second group of connection points, including a second connection point, having a layout identical to the first layout, to interface with a second chip; and
    an intermediate connection point coupled to the first and second connection points through first and second branch traces each having substantially the same electrical length.

2. The substrate of claim 1, further including additional groups of connection points having layouts identical to the first layout, and additional branch traces, having substantially the same electrical length, coupled to additional connection points.

3. The substrate of claim 1, wherein the intermediate connection point is coupled to a root trace.

4. The substrate of claim 3, wherein the root trace is in an internal layer of the substrate.

5. The substrate of claim 3, wherein the root trace is coupled to the connection point of a group of connection points to interface with a third chip.

6. The substrate of claim 5, wherein the third chip is a processor chip.

7. The substrate of claim 1, wherein the intermediate connection point is coupled to a root/branch trace.

8. The substrate of claim 1, wherein the root/branch is on an internal layer of the substrate.

9. The substrate of claim 7, wherein the root/branch trace is coupled to a root trace.

10. The substrate of claim 1, wherein the first and second chips are cache chips.

11. The substrate of claim 1, wherein the intermediate connection point includes a via that extends through each layer of the substrate.

12. A multilayered substrate, comprising:
- a primary side including first and third groups of connection points, including first and third connection points, respectively, each having a first layout to interface with first and third chips, respectively;
- a secondary side including second and fourth groups of connection points, including second and fourth connection points, respectively, each having a layout identical to the first layout to interface with second and fourth chips, respectively; and
- a first intermediate connection point coupled to the first and second connection points through first and second branch traces each having substantially the same electrical length, and a second intermediate connection point coupled to the third and fourth connection points through third and fourth branch traces each having substantially the same electrical length.

13. The substrate of claim 12, further including additional groups of connection points having layouts identical to the first layout, and additional branch traces, having substantially the same electrical length, coupled to additional connection points.

14. The substrate of claim 12, wherein the intermediate connection point is coupled to a root trace.

15. The substrate of claim 14, wherein the root trace is coupled to the connection point of a group of connection points to interface with a fifth chip.

16. The substrate of claim 12, wherein the intermediate connection point is coupled to a root/branch trace.

17. The substrate of claim 16, wherein the root/branch trace is coupled to a root trace.

18. A multilayered substrate, comprising:
- a primary side including a first group of connection points, including a first connection point, having a first layout to interface with a first chip having connection points with a layout;
- a secondary side including a second group of connection points, including a second connection point, having a layout identical to the first layout to interface with a second chip having a layout that is identical to the layout of the first chip; and
- an intermediate connection point coupled to the first and second connection points through first and second branch traces each having substantially the same electrical length.

19. A method for constructing a substrate, comprising:
- providing a first connection point in a first group of connection points;
- providing a second connection point in a second group of connection points, the first and second group of connection points having an identical layout;
- providing a first branch trace between an intermediate connection point and the first connection point; and
- providing a second branch trace, having an electrical length substantially equal to that of the first branch trace, between the intermediate connection point and the second connection point.

* * * * *

UNITED STATES PATENT AND TRADEMARK OFFICE
CERTIFICATE OF CORRECTION

PATENT NO.    : 6,118,669
DATED         : September 12, 2000
INVENTOR(S)   : Yee et al.

It is certified that error appears in the above-identified patent and that said Letters Patent is hereby corrected as shown below:

<u>Column 3,</u>
Line 4, delete "substantially same" and insert -- substantially the same --.
Line 35, delete "root/brand" and insert -- root/branch --.

Signed and Sealed this

Fourth Day of June, 2002

Attest:

JAMES E. ROGAN
Attesting Officer    Director of the United States Patent and Trademark Office